(12) United States Patent
Cho et al.

(10) Patent No.: US 9,506,146 B2
(45) Date of Patent: Nov. 29, 2016

(54) THIN FILM VAPOR DEPOSITION METHOD AND THIN FILM VAPOR DEPOSITION APPARATUS

(75) Inventors: Byung-Chul Cho, Pyeongtaek-Si (KR); Ju-Hwan Park, Hwaseong-Si (KR); In-Hwan Yi, Suwan-Si (KR)

(73) Assignee: WONIK IPS CO., LTD. (KR)

( * ) Notice: Subject to any disclaimer, the term of this patent is extended or adjusted under 35 U.S.C. 154(b) by 105 days.

(21) Appl. No.: 13/978,138

(22) PCT Filed: Dec. 29, 2011

(86) PCT No.: PCT/KR2011/010277
§ 371 (c)(1),
(2), (4) Date: Jul. 2, 2013

(87) PCT Pub. No.: WO2012/093806
PCT Pub. Date: Jul. 12, 2012

(65) Prior Publication Data
US 2013/0287949 A1    Oct. 31, 2013

(30) Foreign Application Priority Data

Jan. 4, 2011 (KR) .......... 10-2011-0000479
Dec. 26, 2011 (KR) .......... 10-2011-0142481

(51) Int. Cl.
*C23C 16/455*   (2006.01)
*C23C 16/40*    (2006.01)

(52) U.S. Cl.
CPC ........... *C23C 16/455* (2013.01); *C23C 16/40* (2013.01); *C23C 16/45551* (2013.01)

(58) Field of Classification Search
CPC .......... C23C 16/18; C23C 16/40; C23C 16/45548–16/45551; C23C 16/45574–16/45576; C23C 16/405
See application file for complete search history.

(56) References Cited

U.S. PATENT DOCUMENTS

2002/0043216 A1    4/2002  Hwang et al.
2006/0013955 A1*   1/2006  Senzaki .............. 427/248.1
2007/0215036 A1    9/2007  Park et al.

(Continued)

FOREIGN PATENT DOCUMENTS

JP    2010087236 A    4/2010
KR    100622609 B     8/2006
KR    200766114 A     6/2007

(Continued)

OTHER PUBLICATIONS

International Search Report for PCT/KR2011/010277, mailed Jul. 24, 2012.

(Continued)

*Primary Examiner* — Elizabeth Burkhart

(57) ABSTRACT

Provided is a thin film vapor deposition method capable of implementing ALD or cyclic CVD without the need for operating a valve and vapor depositing a thin film with higher productivity over the conventional method. A thin film vapor deposition apparatus includes a substrate supporting portion having a plurality of substrate mounting portions; and a gas jetting portion comprising a source gas supplier, a reaction gas supplier, and a mixture gas supplier, provided at the upper portion of the substrate supporting portion in which the source gas supplier, the reaction gas supplier and the mixture gas supplier are radially placed, wherein the substrate supporting portion and the gas jetting portion are provided so as to be able to relatively rotate.

4 Claims, 7 Drawing Sheets

(56) References Cited

U.S. PATENT DOCUMENTS

2007/0264840 A1* 11/2007 Itatani et al. .................. 438/758
2008/0193643 A1    8/2008 Dip

FOREIGN PATENT DOCUMENTS

| KR | 20090008799 A | | 1/2009 |
| KR | 20090086375 A | | 8/2009 |
| KR | 20100056258 A | | 5/2010 |
| WO | WO 2009017322 | * | 2/2009 |

OTHER PUBLICATIONS

Written Opinion for PCT/KR2011/010277, mailed Jul. 24, 2012.

* cited by examiner

THIN FILM VAPOR DEPOSITION METHOD AND THIN FILM VAPOR DEPOSITION APPARATUS

TECHNICAL FIELD

The present invention relates to a method and apparatus for depositing a thin film in a semiconductor fabricating process, and more specifically, to a method for depositing thin films on a plurality of substrates by a single process.

BACKGROUND ART

In a thin film fabricating process, atomic layer deposition (ALD) or cyclic chemical vapor deposition (cyclic CVD) has been studied to further improve physical properties of a thin film.

The principle of the ALD is as follows. If a first source gas is fed into a reactor in a gaseous state, the first source gas reacts with a substrate surface, and thus a monatomic layer is chemically absorbed. If the surface is saturated with the first source gas, the first source gas over the atomic layer is physically absorbed due to non-reactivity between the same ligands. The first source gas which is physically absorbed is removed by a purge gas. When a second source gas is fed onto the first layer, a second layer is grown through substitution reaction between ligands of the first and second source uses. Since the second source gas which does not react with the first layer is physically adsorbed, the second source gas is removed by the purge gas. A surface of the second layer is in a state of reacting with the first source gas. The above-described processes constitute one cycle, and a thin film is deposited by repetition of the cycle.

In order to stably maintain the ALD reaction in the reactor, the first source gas and the second source gas should be fed into the reactor while being separately not to be mixed with each other the gaseous state. According to a conventionally general method, the first source gas and the second source gas are fed into the reactor via different gas feed lines at time intervals. A process of separately feeding the purge gas is employed between the feed of the first source gas and the second source gas to remove the residual gas in the reactor. Valves are used to feed the first source gas, the second source gas, and the purge gas at time intervals.

In order to increase a deposition speed and prevent waste of the source gases in the ADL, it is preferable to feed the source gas only by a surface saturation time of the source gases. However, since the surface saturation time is usually less than one second, the valves should be operated several times within a short period. If the valves are operated many times within the short period, there is a problem of rapidly shortening a lifetime of the valves. The whole processing time is affected by a fact that extra source gases are quickly exhausted, and there is a problem in that the whole processing time may be extended if the gas of poor exhaust is used.

Since a complicated gas feed line for feeding the source gases into the reactor and thus a plurality of valves are provided to adjust the source gases when a kind of the source gases is increased, a problem of increasing a cost and assuring an installation space happens. Further, capacity of hardware and software for adjusting the feed of the source gas should be increased. In addition, since each amount of the source gases and the purge gas fed into the reactor is different, pressure in the reactor is frequently varied, so that stability of the process becomes a problem.

As a result, the complexity of the valves and the frequent operation of the valves increase a maintenance cost of the equipment, as well as shortening the lifetime of the valves. Further, since a shutdown time of the equipment caused by the maintenance is increased, its productivity is lowered.

A metallic thin film used in a conventional semiconductor element has a low resistance value, and if it is deposited on a rear surface of the substrate, it causes a lifting problem and degrades an electric property of the semiconductor element. Accordingly, the most of metallic thin film deposition apparatuses are realized by a single wafer-type chamber, rather than a furnace-type chamber for implementing the deposition on only a front surface of the substrate. However, if the metallic thin film is deposited through ALD or cyclic CVD in the single wafer-type chamber, there is a problem in that its productivity is lowered since a deposition time is extended.

DISCLOSURE

Technical Problem

Therefore, an object of the present invention is to provide a thin film vapor deposition method and apparatus which can deposit a thin film with high productivity relative to the related art, while realizing ALD or cyclic CVD without operating valves.

Technical Solution

In order to accomplish the above-mentioned object, a thin film vapor deposition method according to the present invention According to the present invention, there is provided, in a thin film vapor deposition method using a thin film vapor deposition apparatus including a substrate support unit which is installed in a reactor, and is provided with a plurality of substrate seat portions on which substrates are put, and a gas injection unit which is installed above the substrate support unit, and has a source gas supplier for feeding a source gas onto the substrate support unit, a reaction gas supplier for feeding a reaction gas which is reacted with the source gas onto the substrate support unit, and a mixed gas supplier for feeding a mixed gas of the reaction gas and an inert gas onto the substrate support unit, the source gas supplier, the reaction gas supplier, and the mixed gas supplier being radially disposed, and the mixed gas supplier being disposed between the source gas supplier and the reaction gas supplier, the method of vapor depositing a thin film using the thin film vapor deposition apparatus, in which the substrate support unit and the gas injection unit are installed in a relatively rotating manner, the method comprising the steps of: putting a plurality of substrates on the substrate seat portions; and simultaneously feeding the source gas, the mixed gas, and the reaction gas onto the substrate support unit through the gas injection unit to deposit the thin film on the substrate, while the substrate support unit and the gas injection unit relatively rotate. In this instance, the mixed gas supplier is disposed between the source gas supplier and the reaction gas supplier.

First, the plurality of substrates are put on the substrate seat unit, and then the source gas, the reaction gas, and the mixed gas are simultaneously fed to deposit the thin film, while the substrate support unit and the gas injection unit relatively rotate.

The thin film vapor deposition apparatus further includes a plurality of purge gas suppliers, which are disposed among the source gas supplier, the mixed gas supplier, and the reaction gas supplier, for feeding a purge gas onto the substrate support unit, and, in the step of depositing the thin film, the purge gas may be fed onto the substrate support unit together with the source gas, the mixed gas, and the reaction gas to deposit the thin film on the substrate.

It is preferable that the plurality of substrates are symmetrically put on the substrate support unit on the basis of a center of the substrate support unit, and the source gas supplier and the reaction gas supplier are symmetrically disposed on the basis of a center of the gas injection unit.

In the present invention, the source gas supplier, the reaction gas supplier, and the mixed gas supplier may be disposed so that the source gas, the mixed gas, the reaction gas, and the mixed gas are fed in this order onto each substrate by once rotation. If the purge gas is further used, the source gas supplier, the reaction gas supplier, the mixed gas supplier, and the purge gas supplier may be disposed so that the source gas, the mixed gas, the reaction gas, the mixed gas, and the purge gas are fed in this order onto each substrate by once rotation.

Two or more source gas suppliers are symmetrically disposed opposite to each other, the reaction gas supplier is disposed between the source gas supplier and the reaction gas supplier, and the mixed gas supplier is disposed on at least one of the source gas supplier and the reaction gas supplier. In this way, twice or more processes of depositing the thin film are carried out by once rotation.

In the preferred embodiment, the source gas is a Ru source, and the reaction gas is an oxide gas. Pressure in the reactor is set in the range of 0.1 torr to 10 torr. The Ru source may be an organic compound including Ru, and the oxide gas may be at least one selected from a group of $O_2$, $H_2O$, $O_3$, and $H_2O_2$.

A rate of the reaction gas to the inert gas in the mixed gas may be in the range of 1 to 50%.

Further, according to the present invention, there is provided a thin film vapor deposition apparatus comprising: a reactor with a space formed therein; a substrate support unit which is installed in the reactor, and is provided with a plurality of substrate seat portions on which substrates are put; and a gas suppliers including an upper plate installed above the substrate support unit, and a plurality of gas suppliers disposed along a circumferential direction of the upper plate, wherein the plurality of gas suppliers includes a source gas supplier for feeding a source gas in a source gas region on the substrate support unit, a reaction gas supplier for feeding a reaction gas which is reacted with the source gas into a reaction gas region on the substrate support unit, and a mixed gas supplier for feeding a mixed gas of the reaction gas and an inert gas into a mixed gas region on the substrate support unit, the source gas supplier, the reaction gas supplier, and the mixed gas supplier being radially disposed, and the mixed gas supplier being disposed between the source gas supplier and the reaction gas supplier.

In this instance, the source gas supplier and the reaction gas supplier may be symmetrically disposed on the basis of a center of the upper plate, and the mixed gas supplier may be respectively disposed at both sides of the source gas supplier and the reaction gas supplier.

A purge gas supplier may be further disposed between the source gas supplier and the mixed gas supplier, and between the reaction gas supplier and the mixed gas supplier.

A sectional area of the mixed gas region may be larger than an area of at least one of the source gas region and the reaction gas region.

Advantageous Effects

According to the present invention, ALD or cyclic CVDE can be realized, without operating valves. Further, since several substrates can be processed at the same time in a type different from a batch type, a rear surface of the substrate may not be polluted when a thin film of a low resistance value is deposited, such as a metallic thin film. Further, it is possible to deposit the thin film with high productivity rather than a conventional single wafer type which processes only one sheet of substrate.

In particular, the present invention has the excellent effect on the deposition of the $RuO_2$ thin film if the thin film is deposited using the mixed gas of the source gas and the reaction gas. Since the substrate is fed by the mixed gas of the initial inert gas and the oxide gas in a portion except for the source region, it is possible to prevent growth of Ru. Also, it is possible to make a dense RuO2 thin film by adjusting an amount of the oxide gas in an oxide gas region.

BRIEF DESCRIPTION OF THE DRAWINGS

The above objects, other features and advantages of the present invention will become more apparent by describing the preferred embodiments thereof with reference to the accompanying drawings, in which.

BEST MODE

Now, preferred embodiments of the present invention will be described in detail with reference to the accompanying drawings. The embodiments described below are merely exemplary and are not to be construed as limiting the present invention. The description of the present invention is intended to be illustrative, and not to limit the scope of the claims.

Figure 1:
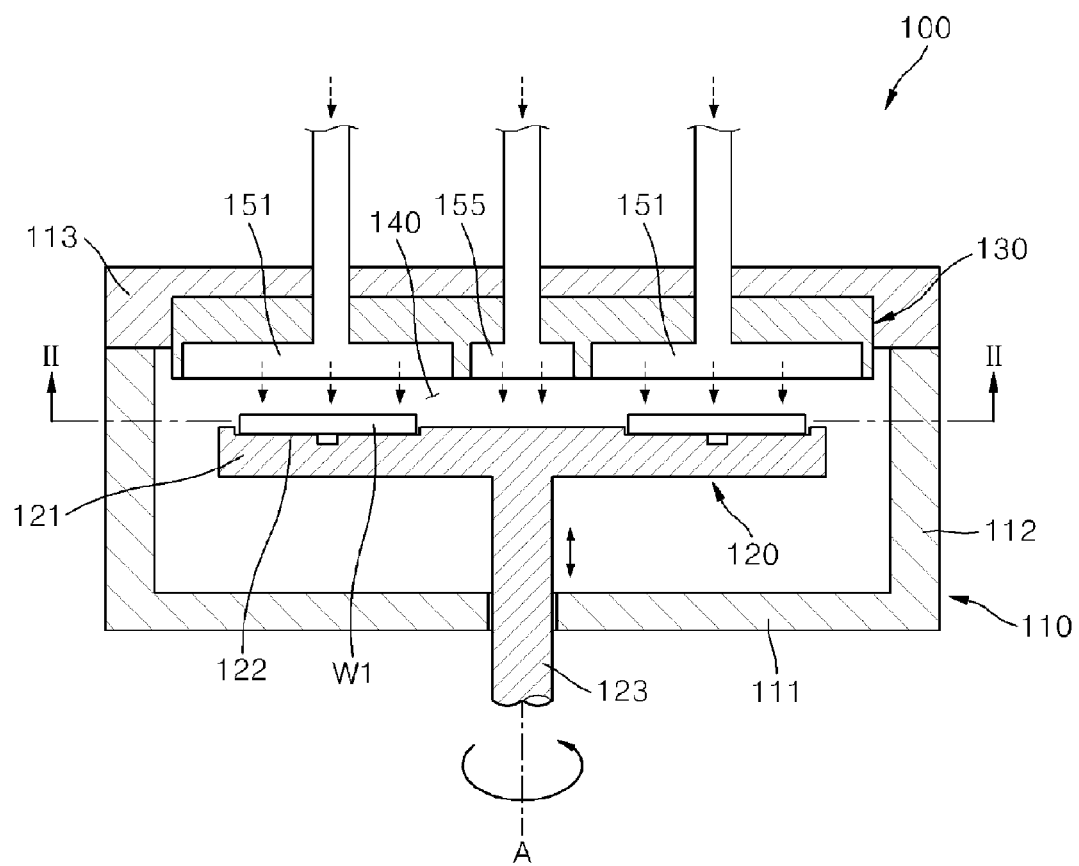
FIG. 1 is a diagram schematically illustrating the configuration of a thin film vapor deposition apparatus for use in the present invention.
Figure 2:
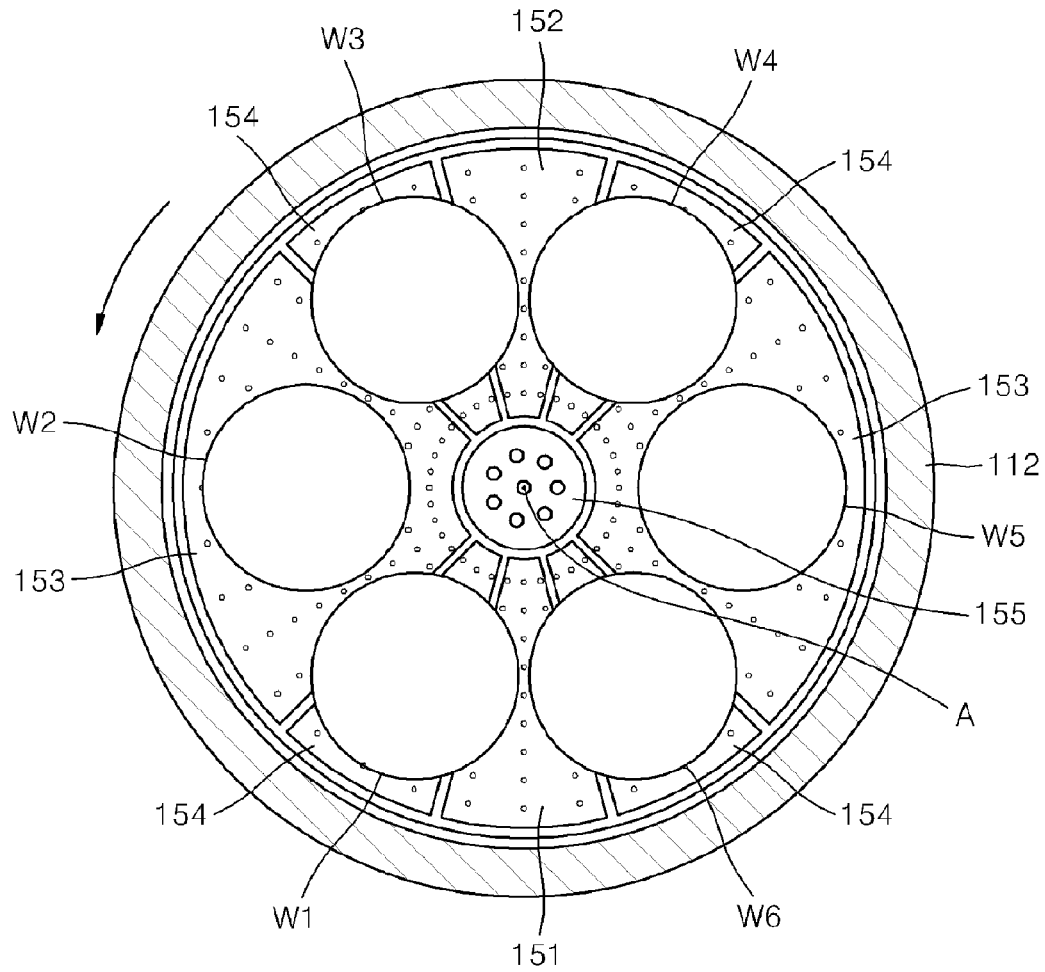
FIG. 2 is a cross-sectional view taken along the line II-II in FIG. 1 to realize a first embodiment of the present invention.

Since ALD or cyclic CVD of the related art is a method of feeding gases by operating valves, the process is complicated, and a lifetime of the valves is shortened by frequent operation of the valves to increase its maintenance cost of the equipment. In order to solve the above drawbacks, a thin film vapor deposition of the present invention can realize ALD or cyclic CVD without operating the valves. FIG. 1 is a diagram schematically illustrating the configuration of the thin film vapor deposition apparatus. FIG. 2 is a cross-sectional view taken along the line II-II in FIG. 1 to illustrate the configuration according to the first embodiment.

Referring to FIGS. 1 and 2, a thin film vapor deposition apparatus 100 includes a reactor 110, a substrate support unit 120, and a gas injection unit 130.

The reactor 110 includes a bottom portion 111, an outer wall portion 112, and an upper plate 113. The bottom portion 111 is formed in a shape of a circular plate, and the outer wall portion 112 is vertically extended from an edge of the bottom portion 111 in an upward direction to form a closed surface. The outer wall portion 112 is provided with a substrate transfer passage (not illustrated) through which a substrate is moved in or out. The upper plate 113 is formed in a shape of a circular plate, and is detachably connected to a top surface of the outer wall portion 112. If the upper plate 113 is connected to the top surface of the outer wall portion 112, a constant space is formed in the reactor 110. In particular, a thin film deposition space 140 is formed between the substrate support unit 120 and the gas injection unit 130 above the substrate support unit 120. A sealing member, such as an O-ring (not illustrated), is interposed between a bottom surface of the upper plate 113 and the top surface of the outer wall portion 112. The bottom portion 111 or the outer wall portion 112 is provided with an outlet port (not illustrated) for discharging unnecessary gas and particles existing in the reactor 110.

The substrate support unit 120 is installed in the reactor 110, and includes a susceptor 121, a substrate seat portion 122, a shaft 123, and a heater (not illustrated). The susceptor 121 is formed in a disc shape, and is rotatably installed in the reactor 110. Two or more substrate seat portions 122 are provided on an upper surface of the susceptor 121, and a description is given of a case where six substrate seat portions are provided in this embodiment. The substrate seat portions 122 are arranged on the upper surface of the substrate support unit 120 along its circumferential direction, and substrates w1 to w6 are put on each substrate seat portion 122. The shaft 123 is connected to a lower surface of the susceptor 121 at one end portion of both end portions thereof, and the other end penetrates the reactor 110, and is connected to a rotation driving unit such as an electric motor (not illustrated). As the shaft 123 is rotated, the susceptor 121 is rotated around a rotation axis A illustrated in FIG. 1. Further, the shaft 123 is connected to a lift driving unit for lifting and lowering the susceptor 121. The lift driving unit may include an electric motor and a gear assembly (not illustrated). The heater (not illustrated) is embedded under the susceptor to adjust a temperature of the substrates (w1 to w6).

The gas injection unit 130 is connected to the upper plate 113 which is installed above the substrate support unit 120, and includes gas suppliers 151 to 155. The gas suppliers 151 to 154 are disposed along the circumferential direction of the upper plate 113, and the number of the gas suppliers and a positional relationship thereof may be varied. The gas supplier 155 is a device capable of feeding a purge gas through a center portion of the substrate support unit 120 to prevent non-reacted gases from being mixed.

If a kind of gases is set to be different from a section of the gas suppliers 151 to 155, the substrates w1 to w6 put on the susceptor 121 pass below the gas suppliers 151 to 155 while being rotated. At that time, the substrates w1 to w6 encounter each gas. If rotation of the substrate support unit 120 is controlled, it is possible to adjust a time when the substrates w1 to w6 encounters each gas. Further, it is possible to control a thin film of wanted thickness by controlling the number of revolutions.

In this embodiment, the gas suppliers 151 to 155 are classified into a source gas supplier 151 for feeding a source gas, such as a precursor, onto the substrate support unit 120, a reaction gas supplier 152 for feeding a reaction gas which reacts with center elements of the precursor to form a reactant, a mixed gas supplier 153 for feeding a mixed gas of an inert gas and the reaction gas onto the substrate support unit 120, and purge gas suppliers 154 and 155 for feeding a purge gas or not feeding any gas. The inert gas includes Ar, $N_2$, and He.

As illustrated in FIG. 2, units formed in block unit of the same size and shape, 12 units in this embodiment, are disposed in the circumferential direction of the upper plate 113, and two or more adjacent units, for example, three adjacent units, may constitute the mixed gas supplier 153. This configuration can be similarly applied to the source gas supplier 151 and the reaction gas supplier 152, as hereinafter described in a second embodiment. In a case where several units for feeding the gas are consecutively arranged or the purge gas supplier is disposed between the units for supplying the gas, these may be considered as one group, which can be defined as one gas supplier.

Meanwhile, a sectional area (area of a horizontal plane) of a region fed by the mixed gas from the mixed gas supplier 153 may be set to be larger than that of a region fed by the source gas from the source gas supplier 151 or that of a region fed by the reaction gas from the reaction gas supplier 152. The reason is to sufficiently assure the sectional area of the region fed by the mixed gas to which the reaction gas and the inert gas are supplied together. For example, the sectional area of the mixed gas region can be increased by increasing the size of the single mixed gas supplier, or by constituting a plurality of adjacent units of the same shape and size as one mixed gas supplier. In this instance, it is preferable that an area ratio of the source gas region or the reaction gas region to the mixed gas region is in the range of 1:1 to 1:2. If the mixed gas region is smaller than the reaction gas region, an unwanted thin film may be deposited. For example, in a case where a thin film of $RuO_2$ is formed, a Ru source is injected from the source gas supplier, and the inert gas and the oxide gas, that is, Ar and O gases, are fed from the mixed gas supplier, thereby depositing an initial thin film of $RuO_2$. The oxide gas capable of oxidizing Ru is fed from the reaction gas to deposit the thin film of $RuO_2$ having a hard film quality. The gas suppliers 151 to 154 are disposed along the circumferential direction of the upper plate 113. Specifically, in this embodiment, one source gas supplier 151 and one reaction gas supplier 152 are disposed opposite to each other, and two mixed gas suppliers 153 are respectively disposed between the source gas supplier 151 and the reaction gas supplier 152. The purge gas suppliers 154 are respectively disposed between the gas suppliers 151, 152 and 153 to fed the purge gas for purging the process gas, such as precursor and reaction gas, onto the substrate support unit 120, thereby discharging the non-reacted gas remained in the thin film forming process 140 outward from the reactor 110 and thus preventing the non-reacted gases from being mixed on the substrate support unit 120. The purge gas supplier 154 may be employed as a blank showerhead, while the purge gas is not fed, as described above.

If the gas injection unit 130 is stationary, and the substrate support unit 120 is rotatably installed to relatively rotate with respect to the substrate support unit 120 and the gas injection unit 130, the substrates w1 to w6 put on the substrate support unit 120 sequentially pass below the respective gas suppliers 151 to 154. In this instance, the substrate w1 is fed by the source gas, the mixed gas of the inert gas and the inert gas, the reaction gas, and the mixed gas of the inert gas and the reaction gas in this order through the respective gas suppliers 151, 152 and 153. If the purge gas is fed through the purge gas supplier 154, the purge gas is fed between the respective steps to realize the ALD. In a case where the purge gas is not fed from the purge gas supplier 154, the cyclic CVD can be implemented. The rate of the reaction gas to the inert gas in the mixed gas may be 1 to 50%.

Accordingly, if the thin film vapor deposition apparatus 100 illustrated in FIG. 1 is employed, the ALD or the cyclic CVD can be realized without operating the valves. Since several substrates can be processed at the same time in a type different from a batch type, a rear surface of the substrate may not be polluted when a thin film of a low resistance value is deposited, such as a metallic thin film. Further, it is possible to deposit the thin film with high productivity rather than a conventional single wafer type which processes only one sheet of substrate.

In particular, the configuration of the apparatus and the thin film vapor deposition method using the apparatus have the excellent effect on the deposition of the $RuO_2$ thin film. The Ru source has a property in which both $RuO_2$ and Ru are grown according to adjustment of an oxidizing agent. Therefore, it is very important to adjust the oxidizing agent in order to form $RuO_2$ rather than Ru using the Ru source.

Figure 3:
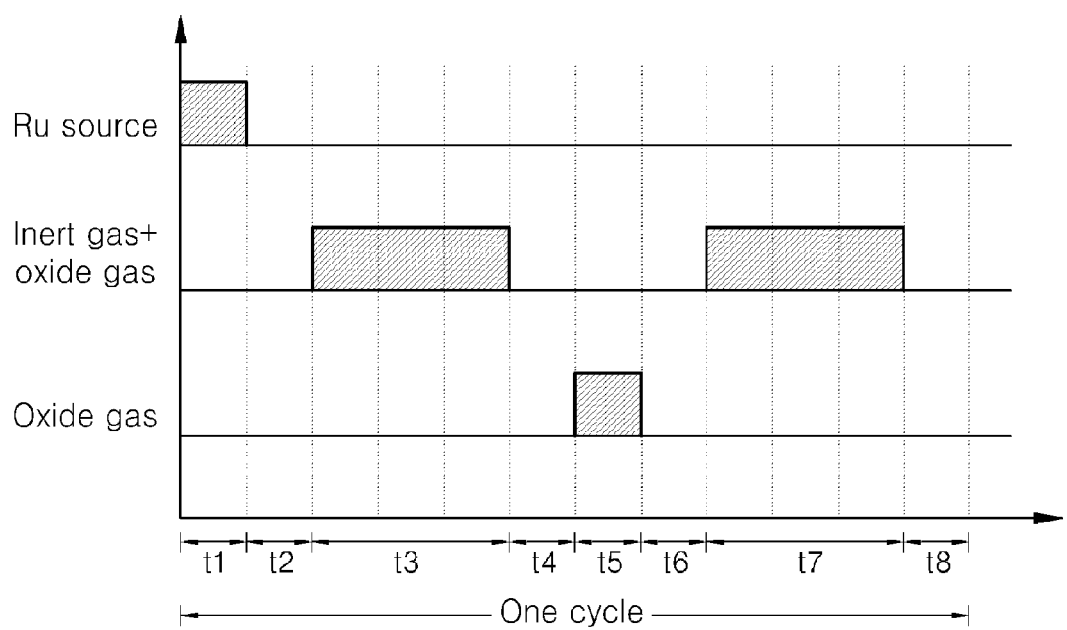
FIGS. 3 and 4 are graphs illustrating a sequential order of gas to be fed onto a rotating substrate in the first embodiment of the present invention.
Figure 4:
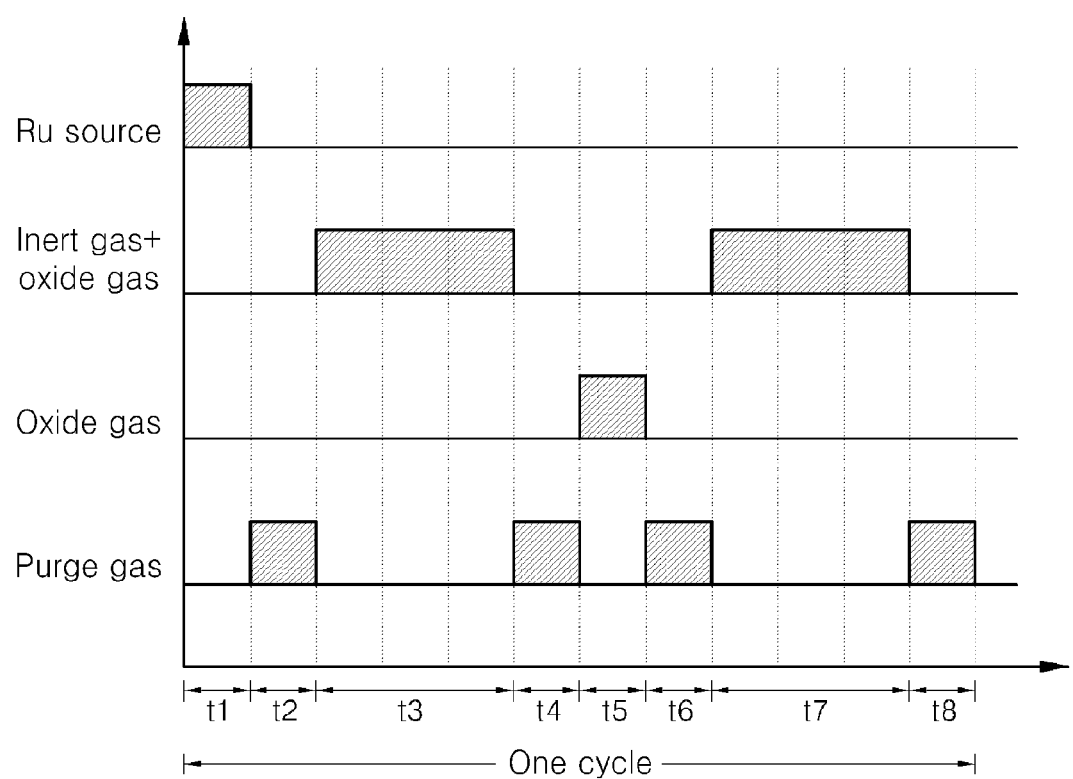

If the pressure of the reactor 110 is set to be in a range of 0.1 torr to 10 torr, the Ru source is fed as the source gas, and an oxide gas is fed as the reaction gas, that is, the oxidizing agent capable of oxidizing the Ru source, when the substrate w1 sequentially passes below the respective gas suppliers 151, 153 and 152, the substrate is fed by the Ru source, the mixed gas of the inert gas and the oxide gas, the oxide gas, and the mixed gas of the inert gas and the oxide gas in this order. The oxide gas may be at least one selected from a group of $O_2$, $H_2O$, $O_3$, and $H_2O_2$. The Ru source may be an organic compound including Ru. For example, DER, $Ru(EtCp)_2$, $Ru(OD)_3$, or the like may be used. FIGS. 3 and 4 are graphs illustrating a gas feeding sequence in this instance.

The substrate w1 is first fed by the Ru source while passing below the source gas supplier 151 (t1). The substrate w1 rotates and simultaneously passes below the purge gas supplier 154 interposed between the source gas supplier 151 and the mixed gas supplier 153 (t2). In this instance, if the purge gas is fed, the ALD is realized, as illustrated in FIG. 4, while if the purge gas is not fed, the cyclic CVD is realized, as illustrated in FIG. 3. Continuously, the substrate w1 rotates and simultaneously passes below the mixed gas supplier 153. At that time, the mixed gas of the inert gas and the oxide gas is fed onto the substrate w1 (t3). The substrate w1 continuously rotates and simultaneously passes below the purge gas supplier 154 interposed between the mixed gas supplier 153 and the reaction gas supplier 152 (t4). Subsequently, the substrate w1 rotates and simultaneously passes below the reaction gas supplier 152. At that time, the oxide gas is fed onto the substrate w1 (t5). Subsequently, the substrate w1 passes below the purge gas supplier 154 interposed between the reaction gas supplier 152 and the mixed gas supplier 153 (t6). The substrate w1 continuously rotates and simultaneously passes below the mixed gas supplier 153. At that time, the mixed gas of the inert gas and the oxide gas is fed onto the substrate w1 (t7). Subsequently, the substrate w1 passes below the purge gas supplier 154 interposed between the mixed gas supplier 153 and the source gas supplier 151 (t8).

In this way, the Ru source, the inert gas, and the oxide gas are simultaneously fed, but, according to the configuration of a space division and the rotation of the substrates w1 to w6, the substrates w1 to w6 are fed by the Ru source, the mixed gas of the inert gas and the oxide gas, the oxide gas, and the mixed gas of the inert gas and the oxide gas in this order, or by the Ru source, the purge gas, the mixed gas of the inert gas and the oxide gas, the purge gas, the oxide gas, the purge gas, the mixed gas of the inert gas and the oxide gas, and the purge gas in this order. Accordingly, since the substrates w1 to w6 are fed by the mixed gas of the initial inert gas and the oxide gas in the area which is not the source region, the growth of Ru is prevented, and the $RuO_2$ thin film can be densely formed by adjusting the amount of the oxide gas in the oxide gas region. According to the state of the reactor 110, the regions of the Ru source, the inert gas, and the oxide gas can be respectively controlled, and the amount of the oxide gas in the oxide gas region and the amount of the oxide gas in the region of the inert gas and the oxide gas may be same or different from each other depending upon the amount of the inert gas.

If the cycle of the above steps t1 to t8 is repeated and the number of revolutions of the substrates w1 to w6 is adjusted, $RuO_2$ having a wanted thickness can be grown.

Figure 5:
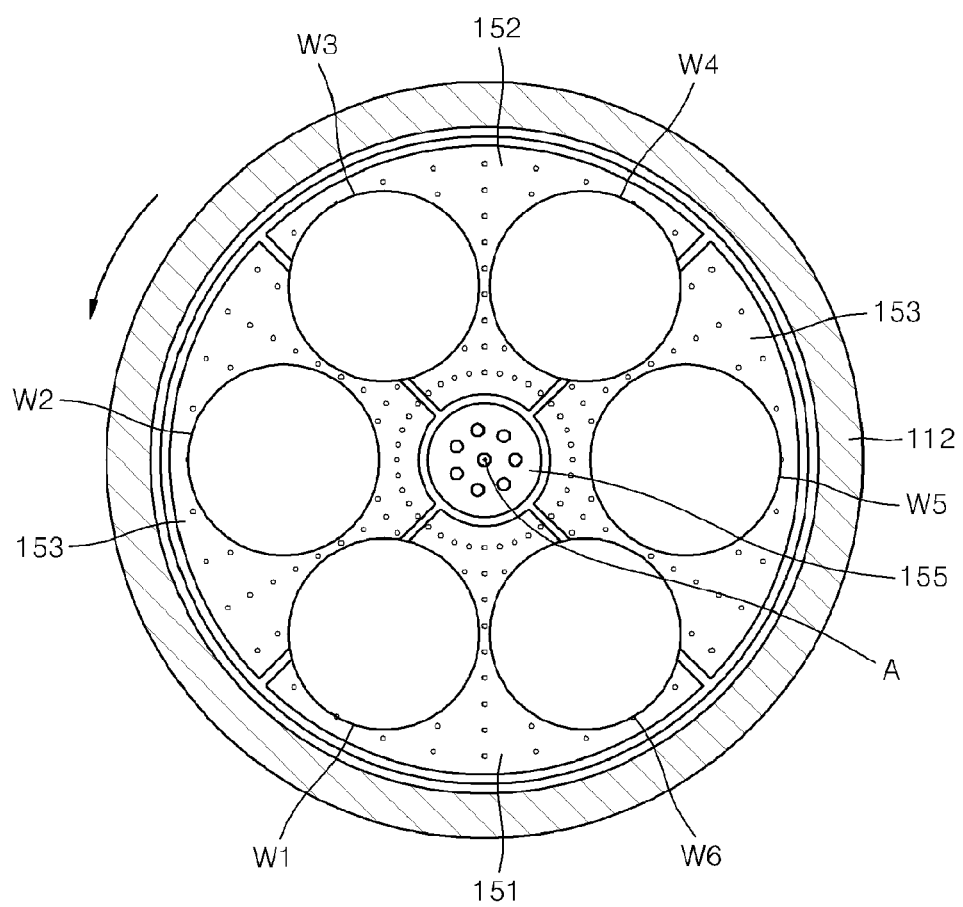
FIG. 5 is a cross-sectional view taken along the line II-II in FIG. 1 to realize a second embodiment of the present invention.

FIG. 5 is a cross-sectional view taken along the line II-II in FIG. 1 to show the configuration according to the second embodiment of the present invention.

Referring to FIG. 5, the gas injection unit 130 includes only the gas suppliers 151, 152, 153 and 155, except for the purge gas supplier 154, as illustrated in FIG. 2.

Each gas supplier is composed by grouping three adjacent source gas suppliers 151, three adjacent reaction gas suppliers 152, and three adjacent mixed gas suppliers 153. If the substrate support unit 120 relatively rotates with respect to the gas injection unit 130, the substrates w1 to w6 put on the substrate support unit 120 sequentially pass below the respective gas suppliers 151, 153 and 152. For example, the substrate w1 is fed by the source gas, the mixed gas of the inert gas and the reaction gas, and the reaction gas, and the mixed gas of the inert gas and the reaction gas in this order through the respective gas suppliers 151, 153, 152 153 to realize the cyclic CVD.

Figure 6:
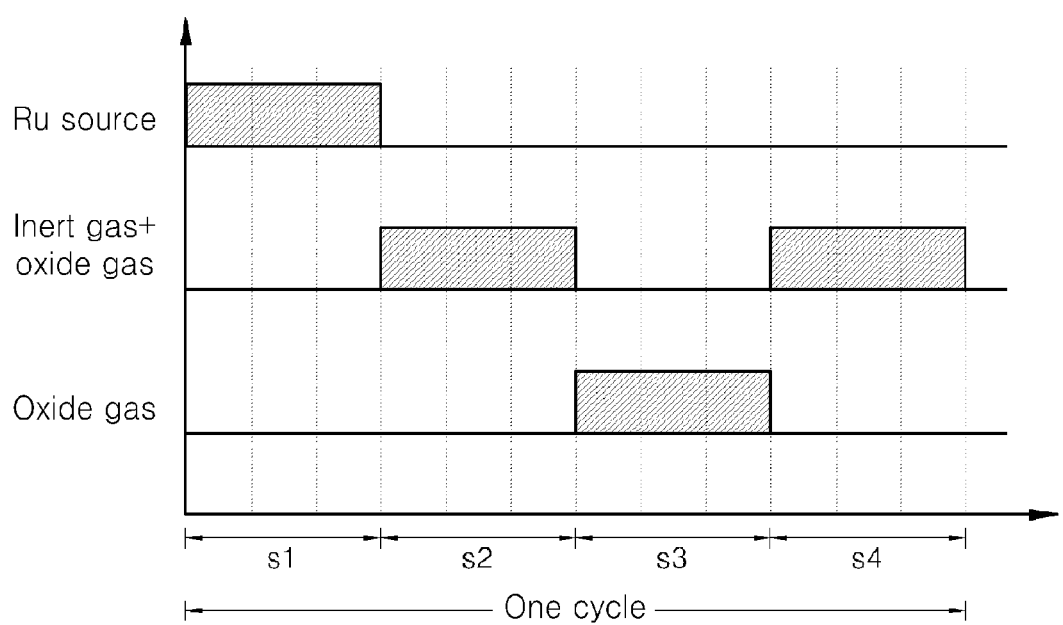
FIG. 6 is a graph illustrating a sequential order of gas to be fed onto a rotating substrate in the second embodiment of the present invention.

FIG. 6 is a graph illustrating a gas feed sequence according to the second embodiment of the present invention.

If the Ru source is fed as the source gas, and the oxide gas capable of oxidizing the Ru source is fed as the reaction gas, the substrate w1 is first fed by the Ru source while passing below the source gas supplier 151 (s1). The substrate w1 rotates and simultaneously passes below the mixed gas supplier 153. At that time, the mixed gas of the inert gas and the oxide gas is fed onto the substrate w1 (t2). The substrate w1 continuously rotates and simultaneously passes below the reaction gas supplier 152. At that time, the oxide gas is fed onto the substrate w1 (t3). Subsequently, the substrate w1 passes below the mixed gas supplier 153. At that time, the mixed gas of the inert gas and the oxide gas is again fed onto the substrate w1 (t4).

The source gas supplier 151 and the reaction gas supplier 152 according to this embodiment are widened relative to those of the first embodiment, so that the RU source supply (s1) and the oxide gas supply (s3) according to this embodiment are extended relative to the Ru source supply (t1) and the oxide gas supply (t5) of the first embodiment. A duration time of each step can be appropriately changed according to the unit configuration of the gas supplier.

Figure 7:
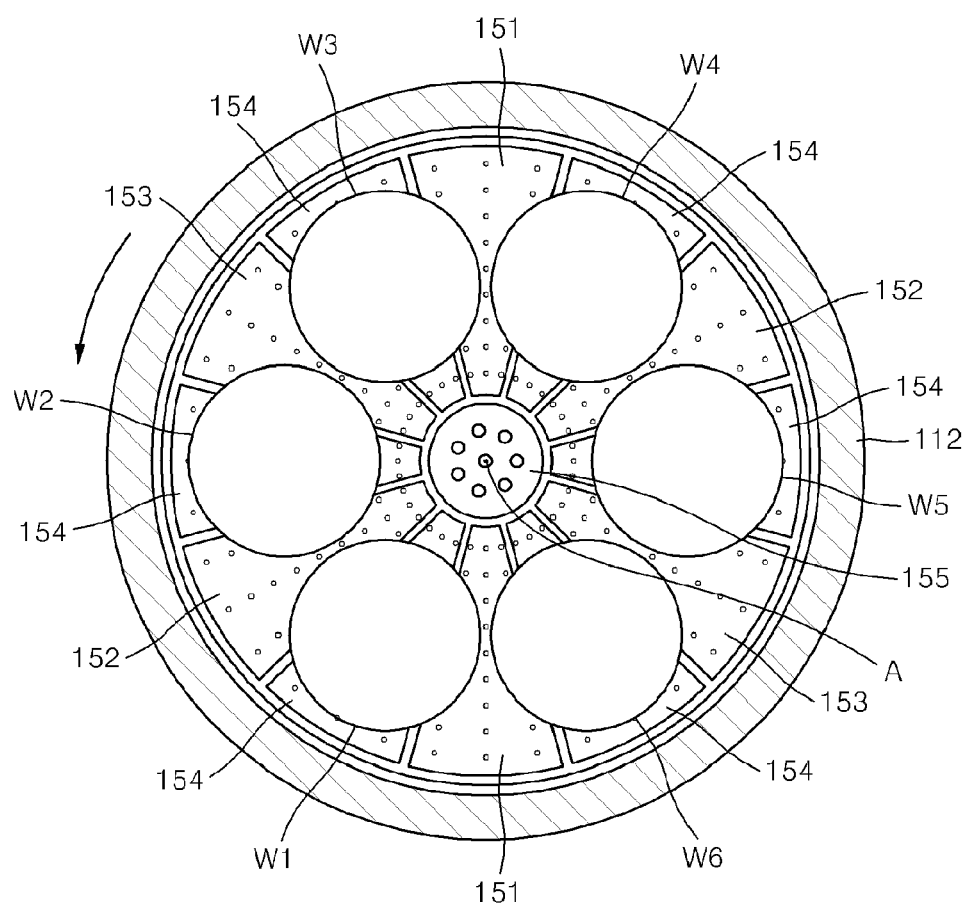
FIG. 7 is another cross-sectional view taken along the line II-II in FIG. 1 to realize a third embodiment of the present invention.

FIG. 7 is another cross-sectional view taken along the line II-II in FIG. 1 to show the configuration according to the third embodiment of the present invention.

Referring to FIG. 7, the gas injection unit 130 includes the gas suppliers 151 to 155. The gas suppliers 151 to 154 are disposed along the circumferential direction of the upper plate 113. Specifically, in this embodiment, two source gas suppliers 151 are disposed opposite to each other, and both the reaction gas supplier 152 and the mixed gas suppliers 153 are respectively disposed at both sides of the source gas supplier 151.

If the substrate support unit 120 relatively rotates with respect to the gas injection unit 130, the substrates w1 to w6 put on the substrate support unit 120 sequentially pass below the respective gas suppliers 151 to 154. At that time, two substrates w1 and w4 are fed by the source gas, the mixed gas of the inert gas and the reaction gas, and the reaction gas in this order through the respective gas suppliers 151, 152 and 153. In other words, the gas injection unit 130 is provided with repetitive regions to repeat the process twice when the substrates w1 to w6 rotate once. Of course, when the substrates rotate once, it is possible to repeat the process three times or more by adjusting the number of repetitive regions in the gas injection unit 130.

However, the thin film vapor deposition method according to the present invention is not limited to the thin film vapor deposition apparatus 100 illustrated in FIG. 1, and can employ other thin film vapor deposition apparatus if the substrate support unit and the gas injection unit relatively rotate. In this instance, the substrate support unit is installed in the reactor, and is provided with a plurality of substrate seat portions on which the substrates are sat. The gas injection unit includes the source gas supplier, the reaction gas supplier, the mixed gas supplier of the inert gas and the reaction gas, and the purge gas supplier, which are disposed in a radial direction. The source gas supplier is a gas supply device for feeding the source gas onto the substrate support unit, and the reaction gas supplier is a gas supply device for feeding the reaction gas which is reacted with the source gas onto the substrate support unit. The purge gas supplier is a gas supply device for feeding the purge gas which purges the source gas and the reaction gas onto the substrate support unit, and is disposed among the source gas supplier, the mixed gas supplier, and the reaction gas supplier. Preferably, the gas injection unit includes the same number of source gas suppliers and reaction gas suppliers. It is preferable that the source gas suppliers and the reaction gas suppliers are symmetrically disposed on the basis of the center of the gas injection unit, respectively, and the mixed gas supplier is interposed between the source gas supplier and the reaction gas supplier. If two or more source gas suppliers are provided, it is preferable that the source gas suppliers are symmetrically disposed on the basis of the center of the gas injection unit, the reaction gas supplier is disposed between the source gas suppliers, and the mixed gas supplier is disposed on at least one of the source gas supplier and the reaction gas supplier. Further, it is preferable that the substrate seat portions are symmetrically disposed on the basis of the center of the substrate support unit.

While the present invention has been shown and described with reference to exemplary embodiments thereof, it will be understood by those skilled in the art that various changes in form and details may be made therein without departing from the spirit and scope of the present disclosure as defined by the following claims.

The invention claimed is:

1. In a thin film vapor deposition method using a thin film vapor deposition apparatus including a substrate support unit which is installed in a reactor, and is provided with a plurality of substrate seat portions on which a plurality of substrates are put, and a gas injection unit which is installed above the substrate support unit, and has a source gas supplier for feeding a source gas onto the substrate support unit, a reaction gas supplier for feeding a reaction gas which is reacted with the source gas onto the substrate support unit, and a mixed gas supplier for feeding a mixed gas of the reaction gas and an inert gas onto the substrate support unit, the source gas supplier, the reaction gas supplier, and the mixed gas supplier being radially disposed, and the mixed gas supplier being disposed between the source gas supplier and the reaction gas supplier, a method of vapor depositing a thin film using the thin film vapor deposition apparatus, in which the substrate support unit and the gas injection unit are installed in a relatively rotating manner, the method comprising the steps of:

putting the plurality of substrates on the substrate seat portions;

simultaneously supplying the source gas, the reaction gas, and the mixed gas onto the substrate support unit through the gas injection unit; and feeding the source gas, the mixed gas, the reaction gas and the mixed gas sequentially on each of the plurality of substrate to deposit the thin film on the plurality of substrates while the substrate support unit and the gas injection unit relatively rotate, wherein two or more source gas suppliers are symmetrically disposed opposite to each other, the reaction gas supplier is disposed between the source gas suppliers, and the mixed gas supplier is disposed on at least one of the source gas supplier and the reaction gas supplier, wherein the source gas is a Ru source, and the reaction gas is an oxide gas, and wherein the Ru source is an organic compound including Ru, and the oxide gas is at least one selected from a group of $O_2$, $H_2O$, $O_3$, and $H_2O_2$, wherein a rate of the reaction gas to the inert gas in the mixed gas is in a range of 1 to 50%, and wherein the mixed gas is provided to the substrate to restrain growth of Ru and deposit a $RuO_2$ thin film, and the reaction gas is provided to the substrate to densify the RuO2 thin film.

2. The thin film vapor deposition method according to claim 1, wherein the thin film vapor deposition apparatus further includes a plurality of purge gas suppliers, which are disposed among the source gas supplier, the mixed gas supplier, and the reaction gas supplier, for feeding a purge gas onto the substrate support unit, and, in the step of depositing the thin film, the purge gas is fed onto the substrate support unit together with the source gas, the mixed gas, and the reaction gas to deposit the thin film on the substrate.

3. The thin film vapor deposition method according to claim 1, wherein the plurality of substrates are symmetrically put on the substrate support unit on the basis of a center of the substrate support unit.

4. The thin film vapor deposition method according to claim 3, wherein the source gas supplier and the reaction gas supplier are symmetrically disposed on the basis of a center of the gas injection unit.

* * * * *